(12) United States Patent
Lojek

(10) Patent No.: US 6,690,059 B1
(45) Date of Patent: Feb. 10, 2004

(54) NANOCRYSTAL ELECTRON DEVICE

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 12 days.

(21) Appl. No.: 10/227,061

(22) Filed: Aug. 22, 2002

(51) Int. Cl.[7] .................................................. H01L 29/788
(52) U.S. Cl. ...................................... 257/316; 257/321
(58) Field of Search ................................... 257/316, 321; 438/257–267

(56) References Cited

U.S. PATENT DOCUMENTS

| | | | |
|---|---|---|---|
| 5,714,766 A | * 2/1998 | Chen et al. ..................... | 257/17 |
| 5,937,295 A | * 8/1999 | Chen et al. .................... | 438/257 |
| 6,054,349 A | 4/2000 | Nakajima et al. ............. | 438/257 |
| 6,300,193 B1 | 10/2001 | Forbes ......................... | 438/257 |
| 6,320,784 B1 | 11/2001 | Muralidhar et al. .......... | 365/151 |
| 6,331,463 B1 | 12/2001 | Chen ............................ | 438/257 |
| 6,344,403 B1 | 2/2002 | Madhukar et al. ............ | 438/503 |
| 6,351,411 B2 | 2/2002 | Forbes et al. ................. | 365/182 |
| 6,586,785 B2 | * 7/2003 | Flagan et al. ................. | 257/261 |

* cited by examiner

*Primary Examiner*—Richard Booth
(74) *Attorney, Agent, or Firm*—Thomas Schneck; Mark Protsik

(57) ABSTRACT

A MOS transistor having utility as a charge storage device, as in a nonvolatile memory device, or as an amplifier, using the charge storage feature of the device as a way to modulate the conductivity of a channel between source and drain electrodes. Over a doped substrate, a gate oxide layer isolates a doped, electrically isolated, charge reservoir layer from the substrate. An overlying tunnel barrier layer isolates the charge reservoir layer from a nanocrystal layer capable of receiving or dispensing electric charge to the charge reservoir layer under the influence of a control gate overlying the nanocrystal layer and separated by an oxide layer. Electric charge on the charge reservoir layer influences the conductivity of the channel. The device may be operated in a memory mode, like an EEPROM, or in an amplifier mode where changes in the gate voltage are reflected in conductivity changes of the channel.

11 Claims, 3 Drawing Sheets

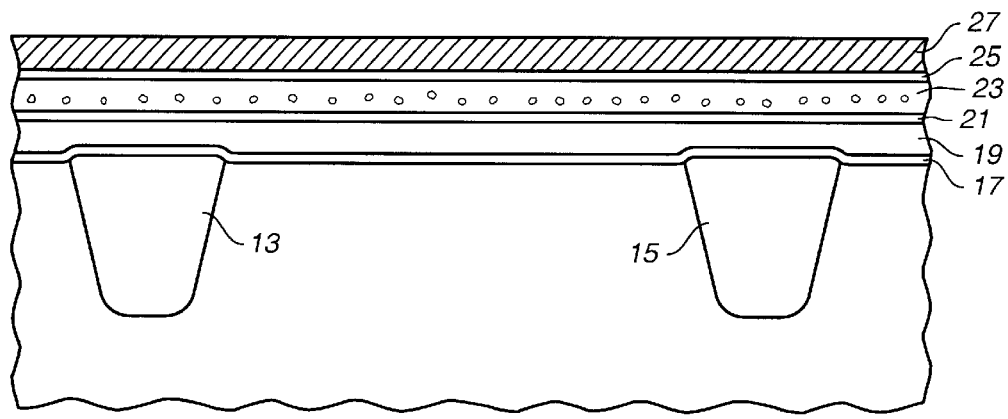
FIG._1
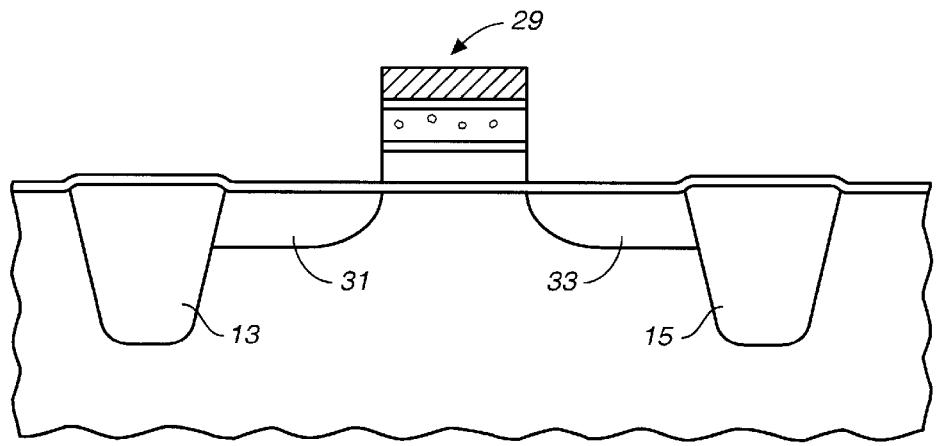
FIG._2
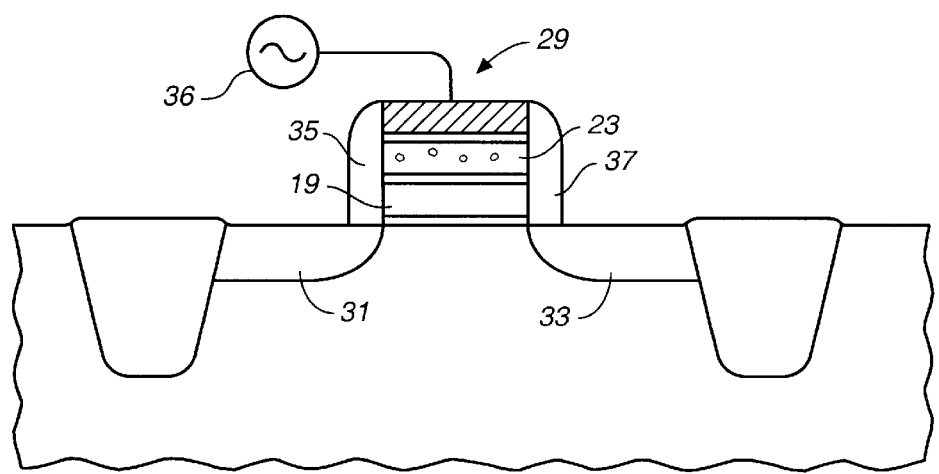
FIG._3

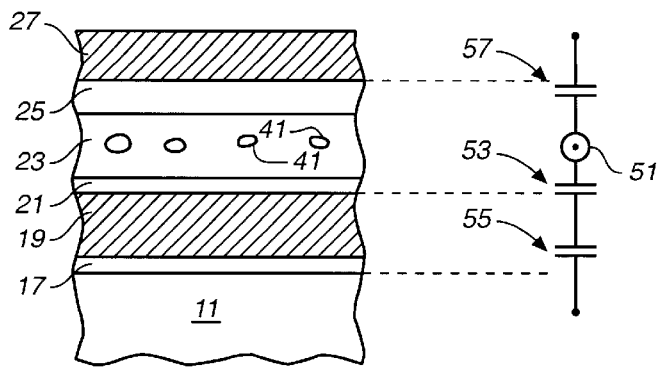
FIG._4
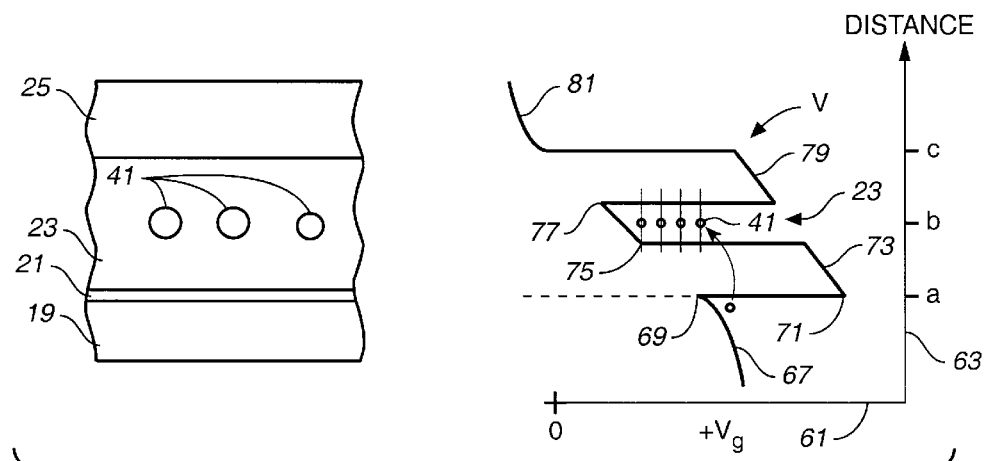
FIG._5
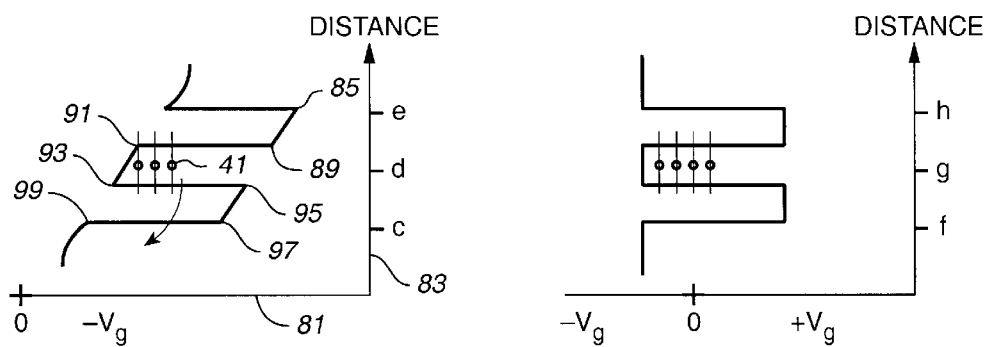
FIG._6  FIG._7

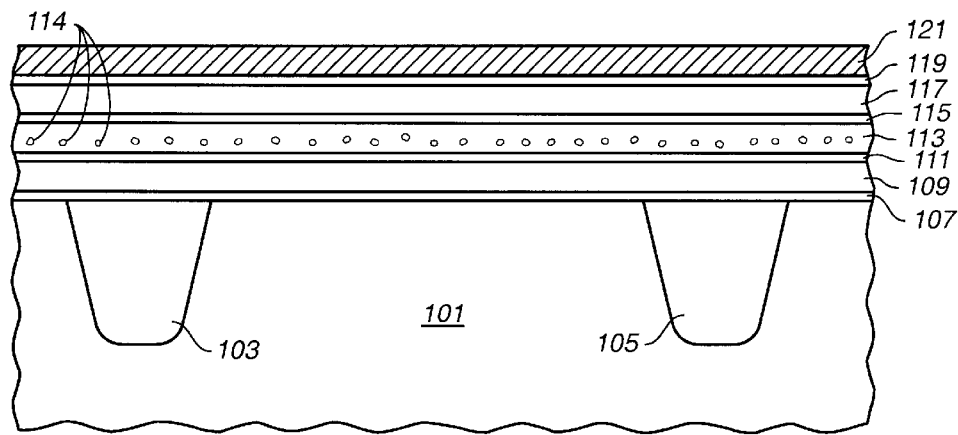
FIG._8
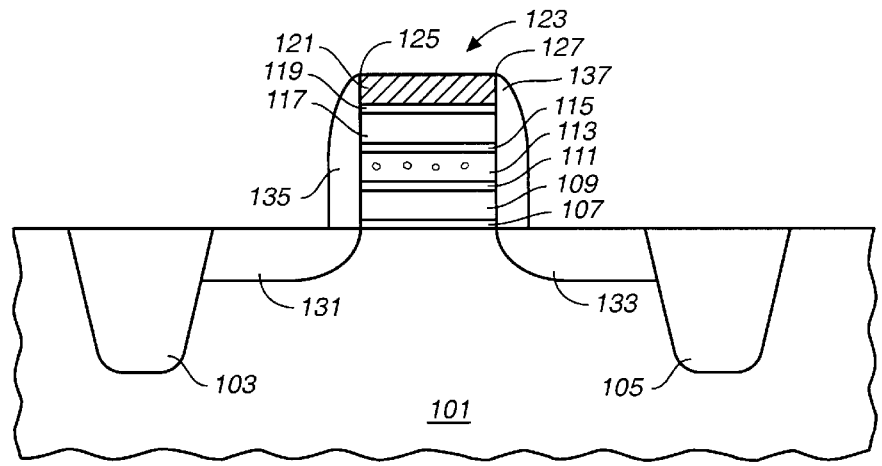
FIG._9
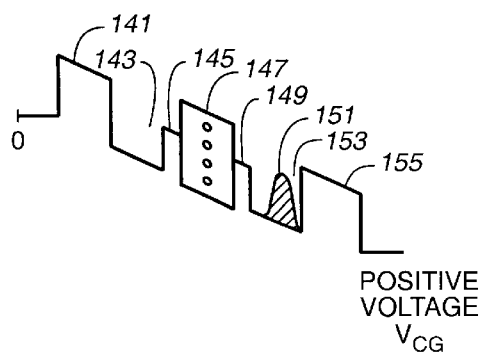
FIG._10A
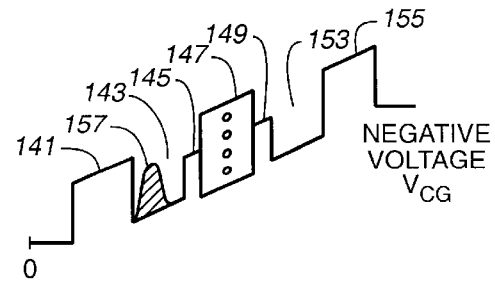
FIG._10B

NANOCRYSTAL ELECTRON DEVICE

TECHNICAL FIELD

The invention relates to transistor construction and uses and, in particular, to a transistor employing nanocrystals which may be used as a memory cell or amplifier.

BACKGROUND ART

In recent years, it has been discovered that nanocrystals are effective in storing small amounts of electric charge in microscopic metal or semiconductor particles involving only a few atoms. The advantage of fabricating such devices is that transistors may be made exceedingly small because the charge storage structures have nanometer size. However, in fabricating such devices many times photolithography is used to form structures around the nanocrystals. This limits the minimum size for memory transistors because the device is subject to the resolution limits of photolithography. Nevertheless, even with such limits, very small devices of great utility may be made.

For example, in U.S. Pat. No. 6,054,349 to Nakajima et al. discloses a single electron device having an insulated film on a substrate with a plurality of nanometer size conductive particles formed in the insulating film in an interface between the substrate and the insulating film. The conductive particles are effective for trapping single electrons for charge storage purposes in a memory transistor. A similar structure is shown in U.S. Pat. No. 6,320,784 to Muralidhar et al. The device features a substrate with source and drain regions, a tunnel dielectric above the substrate and between the source and drain, and a floating gate over the tunnel dielectric. Electrons for charge storage are pulled from the substrate by a control gate.

The beauty of nanocrystal structures of the prior art is that nonvolatile memories can be formed, particularly EEPROM transistors of very small size, low power dissipation, and with simple fabrication techniques.

An object of the invention was to devise an improved transistor device employing nanocrystal charge storage.

SUMMARY OF THE INVENTION

The above object has been achieved in a nanocrystal transistor which uses a floating gate as a charge storage region, transferring charge through a tunneling barrier to nanocrystals. Unlike the prior art, where charge has been pulled from the substrate, the present invention relies on a separate charge reservoir, which can be doped specifically for charge supply, while the substrate is doped for conductivity between source and drain electrodes. By pulling charge from the charge reservoir to a separated nanocrystal layer, the electrostatic properties of the nanocrystal layer are modified, influencing a subsurface channel between source and drain in a MOS transistor. So unlike the prior art, where the nanocrystals themselves exert direct influence on the channel, the present invention is just the opposite. The nanocrystals are used to modify electrostatic properties of a separated region and then directly influence channel behavior in the usual way, characteristic of a MOS transistor. In the simplest mode of operation, a threshold may be established for charge transfer from the charge supply layer to the nanocrystal layer and this threshold is similar to the threshold of non-volatile memory transistors. However, further voltage changes will cause further electron transitions from the charge supply layer to the nanocrystal layer whereby the conductivity of the channel is changed in a stepwise manner, like modulation. Reverse voltages will cause depletion of the nanocrystal layer, driving electrons from the nanocrystal layer back to the charge supply layer. This modulation of the channel allows the transistor to behave as an amplifier in another mode of operation wherein channel conductivity tracks the input signal. Conduction between source and drain amplifies the gate voltage in the amplifier mode or senses the pinch-off characteristic in the memory mode. Multiple levels of pinch-off may be sensed so that multilevel storage may be achieved.

BRIEF DESCRIPTION OF THE DRAWINGS

FIG. 1 is a side plan view of sequential layers deposited on a semiconductor substrate for forming a MOS memory transistor of the present invention.

FIG. 2 is a side plan view of a mesa structure formed from the layers shown in FIG. 1 and used for self-aligned implantation of source and drain regions.

FIG. 3 is a side plan view of the mesa structure shown in FIG. 2 with the addition of protective sidewall nitride spacers.

FIG. 4 is an electrical operational view of the charge storage characteristic of the mesa structure of FIG. 2 operating in a read mode.

FIG. 5 is an electrical operational view of the mesa structure illustrated in FIG. 4 operating in a write mode.

FIG. 6 is an electrical operational plan view of the structure of FIG. 4 in an erase mode.

FIG. 7 is an electrical operational view of the mesa structure of FIG. 4 in a charge retention mode.

FIG. 8 is a side plan view of sequential layers deposited on a semiconductor substrate for forming an alternate embodiment of the transistor illustrated in FIG. 1.

FIG. 9 is a side plan view of a mesa structure formed from the layers shown in FIG. 8 and used for self-aligned implantation of source and drain regions.

FIGS. 10a and 10b are electrical operational views of the mesa structure illustrated in FIG. 9.

BEST MODE FOR CARRYING OUT THE INVENTION

With reference to FIG. 1, a p-type semiconductor substrate 11 is doped in the usual way for formation of a MOS or CMOS EEPROM device. STI isolation regions 13 and 15, known in the art, are implanted within the substrate to define the active area of the device. Other isolation methods may be used, with LOCOS isolation being preferred.

Before formation of layers on the substrate, the surface of the substrate is prepared in the usual way by CMP polishing. Then a layer of thermal oxide having a thickness of 50–150 angstroms is deposited for formation of a gate oxide layer 17.

Next, a charge supply layer 19 or "charge reservoir" is built by depositing a layer of amorphous silicon to a thickness of approximately 500 angstroms. This layer is then doped to a desired degree of conductivity which must be experimentally determined. Conductivity is very slight, but free electrons are available. This layer is electrically floating, i.e. not connected to any conduction or source of charge.

Next, a tunnel barrier layer 21 is deposited over the charge reservoir layer 19. The barrier layer is intended to be an insulative layer with silicon dioxide as a preferred material.

The thickness of tunnel barrier layer 21 is carefully controlled to maintain the thickness of this insulative layer to between 20–50 angstroms, otherwise tunneling voltages must be raised to levels which are not practical in most applications. However, for some applications, it is possible that the thickness of the tunneling barrier layer exceed 50 angstroms. Uniformity of the tunnel barrier layer is important.

Next, a nanocrystal layer 23 is formed by depositing an insulative layer such as silicon dioxide, to a thickness of 200 angstroms. This layer is annealed to relieve stress prior to ion implantation. For example, silicon ions may be implanted with a dose of $1-5 \times 10^{16}$ atoms/cm$^2$, deposited at low energy (e.g., 2 keV). Other ion species, such as germanium, aluminum, copper or other metals could be used. The actual dose which is selected is based upon experimental damage profiles showing nanocrystal formation and deposition. The implanted ions internally link silicon atoms to form nanocrystals of silicon suitable for charge storage. The exact mechanism for storage is not known. Various methods of forming nanocrystal films are described in prior art publications. After formation of the nanocrystal layer, the layer is annealed at high temperature under vacuum.

After formation of the nanocrystal layer 23, a layer of thermal oxide 25 is deposited to a thickness of between 50–150 angstroms. Lastly, a layer of polysilicon 27 is deposited over the thermal oxide layer. The polysilicon layer will form a control gate and be connected to an electrode. Subsequent protective layers may be deposited in a usual way. In particular, a nitride layer, not shown, may be deposited as a protective layer for subsequent ion implantation.

In FIG. 2, all of the deposited layers shown in FIG. 1 have been removed, except at a central zone of the active area where mesa structure 29 is defined, incorporating portions of all of the layers shown in FIG. 1, including a protective layer covering the mesa structure, but not shown. The mesa structure is used as a self-alignment tool for depositing source 31 and drain 33 by diffusion or ion implantation as subsurface electrodes in substrate 11. Source 31 contacts isolation region 13 and extends inwardly to approximately the left edge of mesa structure 29 while drain 33 extends from the isolation structure 15 to the right edge of mesa structure 29. After formation of source and drain, the uppermost protective layer over the mesa may be removed.

In FIG. 3, the mesa structure 29 is shown to have nitride spacers 35 and 37 added to the exposed edges of the mesa structure to prevent charge migration into the various layers by mobile ions or electrons. In particular, it is important to protect the integrity of the charge reservoir layer 19, as well as the nanocrystal layer 23. This allows charge reservoir layer 19 to behave as an electrically isolated structure similar in some respects to a floating gate in EEPROM construction. It is rare that an electrically active layer not be connected to conductors.

With reference to FIG. 4, nanocrystal layer 23 may be seen to contain three exemplary nanocrystals 41. The actual number is larger. Nanocrystal layer 23 is separated from substrate 11 by gate oxide 17 and tunnel barrier layer 21. From the standpoint of nanoparticles 41, capacitance exists between the nanoparticles and the substrate. Hypothetical nanoparticle 51 is shown to be in a capacitive relationship relative to the substrate, separated by capacitor 53, being the capacitance between the nanoparticle and the charge reservoir layer 19. A further capacitance 55 exists between the charge reservoir layer and the substrate. In each case, an insulative layer 21 and 17 is the insulator of each of the parasitic capacitors 53 and 55, respectively. Similarly, a parasitic capacitance 57 exists between the hypothetical nanoparticle 51 and the control poly layer 27. The thermal oxide layer 25 acts as the insulator for capacitor 57.

In FIG. 5, there is a magnification of the structure illustrated in FIG. 4, with the nanocrystal layer 23 and the charge reservoir layer 19 having an electrical gate voltage versus distance characteristic illustrated by a bandgap diagram, with control gate voltage plotted on axis 61 (X-axis) and distance in the layers 19, 21, 23 and 25 relative to the substrate plotted on axis 63 (Y-axis). As voltage is applied between the control gate and the substrate, the plot of FIG. 5 illustrates operation of the device. An arbitrary low voltage may be applied which is higher at a point deeper in the substrate at level 67 and falls off slightly toward the substrate surface at level 69, indicated by "a" on the distance axis. Then, as voltage is increased, a threshold voltage will be reached at point 71 where an electron from charge reservoir layer 19, namely electron 73, tunnels through the tunneling barrier layer 21 and jumps to a nanocrystal 41 in the nanocrystal layer 23. When this occurs, voltage will initially drop, as shown by line 73. Within the insulative nanocrystal layer, voltage drops to near zero levels, indicated by point 75 and even becomes more negative passing through the nanocrystal layer, as indicated by point 77, corresponding to height "b" on the distance axis 63. At the upper surface of the nanocrystal layer, the voltage falloff curve 73 resumes at level 79 until voltage is near the neutral starting point 81. This voltage relationship applies for the situation where charge is being removed from the charge reservoir layer 19 and stored on nanocrystals in nanocrystal layer 23. By removing charge from charge reservoir layer 19, the subsurface channel experiences less electrostatic force. Further charge removal from charge supply layer 19 modulates the conductivity of the channel by electrostatic interaction. Before any charge removal occurs, the channel may be considered at pinch-off, i.e. no conduction between source and drain. When substantial charge removal occurs, there is conduction between source and drain, through the channel, i.e. no pinch-off. With further charge transfer, there is an increasing amount of conduction. The variable amount of channel conduction is referred to as modulation of the channel.

With reference to FIG. 6, operation of the erase mode is shown for the magnified structure shown in FIG. 5. Once again, the X-axis is plotting control gate voltage, as shown by the horizontal line 81, while the distance profile through the device is shown by vertical line 83. Electrons stored in nanocrystal 41 are being removed by negative voltage applied at the control gate with reference to the substrate. A negative voltage at the control gate, height "e" on line 83, appears at the gate oxide 25 to have no effect until a point 85 is reached, a threshold voltage, where an electron in a nanocrystal 41 is expelled by electrostatic repulsion and tunnels through a tunneling barrier oxide, as indicated by arrow 87. The change in electrostatic potential of the nanocrystal layer causes a voltage drop to point 89. Moving into the surface of the insulating material containing the nanocrystals, the voltage immediately falls towards zero at point 91 and even becomes more negative at point 93 at the opposite side of the material containing nanocrystals 41. The distance through the structure is indicated by the height "d" on the distance axis 83. Passing through the insulative nano-crystal layer, the voltage curve appears as an extension of point 89 at point 95 where the voltage profile slopes downwardly to point 97 and, upon entering the tunnel barrier layer, falls off toward zero at point 99.

In FIG. 7, there is a similar voltage characteristic for a charge retention profile. Here, however, positive and negative voltages do not approach the threshold levels seen in FIGS. 5 and 6. In this situation, electric charge remains within the nanocrystals. Changes of voltage below the threshold level will cause the profiles seen at distance heights "f", "g", and "h" on the distance scale. These distances correspond to distances "c", "d" and "e" in FIG. 6 which, in turn, correspond to distances "a", "b" and "c" in FIG. 5.

In summary, a nanocrystal structure displaces and restores charge to a protected charge reservoir layer 19 relative to an upper nanocrystal layer 41. The changes in electronegativity of the charge reservoir cause electrostatic modulation of the channel. For example, a highly negative charge reservoir layer 19 will cause pinch-off of the channel. On the other hand, the removal of charge from the charge reservoir layer to the upper nanocrystal layer will cause stepwise increase in conductivity of the channel until the channel provides a good conductive path between source and drain. Others have shown that single electrons can be dispatched from a charge reservoir layer to a nanocrystal layer, one electron at a time. By carefully controlling the number of electrons supplied from the charge reservoir to the nanocrystal structure, by increasing gate voltage, the conductivity of the channel may be carefully controlled. This provides a means of modulating the channel, thereby controlling conductivity between source and drain in the manner of an amplifier, as well as providing for a digital nonvolatile memory, with several discrete memory states available, depending upon the amount of charge transferred between the charge reservoir layer and the nanocrystal layer.

With reference to FIG. 8, the second embodiment of the nanocrystal layers of FIG. 1 is a symmetric construction of the layers with a charge reservoir layer on each side of a nanocrystal layer. In other words, a charge reservoir layers are placed both below and above the nanocrystal layer. Formerly, the charge reservoir layer was below the nanocrystal layer. However, in the former embodiment, the charge reservoir layer could also have been above the nanocrystal layer. In the present embodiment, two charge reservoir layers are used, both controlled by a single control gate which is above both charge reservoir layers and has the capability of impressing a voltage which is sensed in both charge reservoir layers, as well as the nanocrystal layer thereby influencing a channel between source and drain of a MOS transistor.

In FIG. 8, a substrate 101 is seen to have STI isolation regions 103 and 105. The substrate region is doped in the usual way for a MOS transistor and, similarly, the isolation regions 103 and 105 are formed in the usual way. A first gate oxide layer 107 is formed above the substrate. The layer may be a thermal oxide having a thickness in the range 50–150 angstroms. A first charge reservoir layer 109 is disposed over the first gate oxide layer 107. The charge supply layer may be amorphous silicon doped by ion implantation, similar to the charge reservoir layer 19 of FIG. 1, and has a thickness of approximately 500 angstroms. A thin tunnel barrier layer, preferably vapor deposited silicon dioxide, having a thickness in the range of 20–50 angstroms, is disposed over the first charge supply layer 109. Next, a nanocrystal layer 113 is formed over the tunnel barrier oxide. The nanocrystal layer is an insulating layer where nanocrystals are formed by ion implantation, such as implantation of silicon or metal (Al, Cu) into silicon dioxide. After implantation, the layer is annealed to relieve stress and repair damage to the layer.

Following formation of the nanocrystal layer, symmetric layers of thin tunnel oxide 115, a second charge reservoir layer 117, and a second gate oxide layer 119 are disposed over the nanocrystal layer. Lastly, a polysilicon control gate 121 is disposed over the symmetrically disposed underlying layers. Nanocrystal layer 113 contains a number of nanocrystals 114 which are formed in the manner known in the art. The nanocrystals have a density and size appropriate for storing individual electrons which are pulled into the nanocrystal layer from the charge reservoir layers.

In FIG. 9, the layers have been trimmed at vertical edge regions 125 and 127 to define a mesa structure 123. Once the mesa structure is formed, it may be used for self-alignment of source 131 and drain 133 which are placed in the substrate 101 by diffusion or by implantation. Before this step is taken, the remainder of the structure, including the top of mesa 123, is protected by a mask. After formation of source and drain, the mask is removed. Nitrate spacers 135 and 137 are formed to protect edge regions 125 and 127 from migration of mobile ions or electrons into the edge regions of these layers. This allows the first and second charge reservoir to be electrically isolated members, not influenced by lateral flow of charge from other sources.

In operation, voltage is applied to control gate 121 to electrostatically influence the dimensions of the channel between source 131 and drain 133. The voltage must exceed a threshold before any influence is exerted at all. A positive voltage will pull electrons from one of the charge reservoir layers, say first charge reservoir layer 109, into the nanocrystal layer 113. A further positive voltage may pull electrons further into the second charge reservoir layer 117, again influencing the dimensions of the channel. By being able to manipulate the dimensions of the channel in a discrete or stepwise manner, depending on the number of electrons stored in the nanocrystal layer, the structure has the ability to behave as a multilevel memory device, i.e. having several memory states. A negative voltage applied to the control gate would have an opposite effect, driving electrons out of the second charge reservoir layer 117 toward the nanocrystal layer 113. A further negative voltage would drive electrons from the nanocrystal layer into the first charge reservoir layer 109.

In FIG. 10*a*, there is a voltage plot showing a pair of potential wells 143 and 153 formed on either side of the nanocrystal layer 147. The diagram plots internal elevational positions, relative to the substrate on the X-axis, versus voltage on the Y-axis. The zero position at the left of each plot represents a substrate position with peak 141 representing the position of the first gate oxide, valley 143 representing the first charge reservoir layer, peak 145 representing the tunnel oxide layer, peak 147 representing the nanocrystal layer, peak 149 representing the second tunnel oxide layer, valley 153 representing the second charge reservoir layer, and peak 155 representing the second gate oxide layer. When a positive voltage is applied to the control gate, charge is shifted to valley 153, as depicted by shaded charge peak 151. The valley 153 is a potential well between peaks 149 and 155. Charge will reside in this potential well until forced out of the well by a voltage which is sufficient to overcome peak 149.

Similarly, in FIG. 10*b*, a negative voltage is applied at the control gate driving charge to the valley 143 between peaks 141 and 145. The valley 143, corresponding to the first charge reservoir layer, confines the charge peak 157 as charge has been driven out of the potential well 153 and out of nanocrystal layer 147.

If charge shifting proceeds with positive and negative pulses above the threshold amount, the transistor will behave as a two-state memory device. On the other hand, varying amounts of charge can be supplied by the charge reservoir layers and by the nanocrystal layer. This means that the charge peak 151 or 157 may have dimensions indicative of the amount of charge. This allows the transistor of FIG. 9 to behave as a multi-state memory device, since discrete amounts of voltage can increase the amount of charge shifted by corresponding discrete amounts. If this action is taken very rapidly in response to a varying input signal at the control gate, a channel existing between the source and drain of the MOS device will be modulated in accordance with the control signal applied in a manner similar to that described with reference to FIG. 3. The extent of modulation infers the amount of charge transferred. A calibration curve will establish the transfer function. Thus, the mesa structure of FIG. 9 will also behave as either a memory device capable of storing several simultaneous memory states, as well as a linear amplifier for analog input supplied to the control gate.

What is claimed is:

1. A transistor structure comprising:

a substrate of semiconductor conductivity;

a mesa structure disposed on the substrate with upright side walls, the mesa comprising a layer of gate oxide over the substrate, a doped floating charge reservoir layer over the gate oxide layer, a tunnel barrier layer over the floating charge reservoir layer, a nanocrystal layer disposed over the tunnel layer, an insulative layer over the tunnel layer, and a conductive control gate over the insulative layer; and source and drain regions of a second conductivity type aligned with the upright opposed side walls of the mesa structure, with the mesa defining a channel in the substrate between the source and drain regions with an electric field pinch-off characteristic influenced by the location of electrons in the mesa structure whereby electrons pulled from the charge reservoir layer to the nanocrystal layer change the pinch-off characteristic between source and drain regions thereby changing conductivity between source and drain regions.

2. The transistor of claim 1 wherein a signal source is connected to the conductive control gate.

3. The transistor of claim 2 wherein the signal source is a binary signal applying voltage to the control gate above a positive threshold voltage to write a memory state.

4. The transistor of claim 2 wherein the signal source is a binary signal applying voltage to the control gate below a negative threshold voltage to erase a memory state.

5. The transistor of claim 2 wherein the signal source is variable, capable of modulating the pinch-off characteristic between source and drain regions.

6. The transistor of claim 1 wherein insulative sidewall spacers protect the upright side walls of the mesa structure.

7. The transistor of claim 2 wherein the signal source has multiple discrete voltage levels above a threshold voltage applied to the control gate thereby writing multilevel memory states.

8. The transistor of claim 2 wherein a second tunnel barrier layer and a second charge reservoir layer are symmetrically disposed over the nanocrystal layer relative to corresponding layers under the nanocrystal layer.

9. The transistor of claim 8 wherein a signal source is connected to the conductive control gate, the signal source being variable, capable of modulating the pinch-off characteristic between source and drain.

10. The transistor of claim 8 wherein the signal source is digital.

11. The transistor of claim 8 wherein the signal source is analog.

* * * * *